United States Patent [19]
Jiang

[11] Patent Number: 5,852,379
[45] Date of Patent: Dec. 22, 1998

[54] FUSE TUNABLE, RC-GENERATED PULSE GENERATOR

[75] Inventor: Yong H. Jiang, Milpitas, Calif.

[73] Assignee: Integrated Silicon Solution Inc., Santa Clara, Calif.

[21] Appl. No.: 853,406

[22] Filed: May 9, 1997

[51] Int. Cl.[6] .............................. H03K 3/17; H01H 85/00
[52] U.S. Cl. .......................... 327/176; 327/291; 327/525
[58] Field of Search .............................. 327/12, 165, 166, 327/170, 172–176, 237, 250, 252, 261, 263, 276–278, 284–285, 291, 525; 365/96, 225.7

[56] References Cited

U.S. PATENT DOCUMENTS

| | | | |
|---|---|---|---|
| 4,199,726 | 4/1980 | Bukosky et al. | 327/114 |
| 5,600,274 | 2/1997 | Houston | 327/262 |
| 5,617,049 | 4/1997 | Hirano et al. | 327/173 |
| 5,668,751 | 9/1997 | Sher et al. | 327/525 |
| 5,672,990 | 9/1997 | Chaw | 327/173 |

*Primary Examiner*—My-Trang Nu Ton
*Attorney, Agent, or Firm*—Douglas J. Crisman; Flehr Hohbach Test Albritton & Herbert LLP

[57] ABSTRACT

A tunable phase generator is disclosed suitable for use in integrated circuits. The phase generator includes a delay element wherein passive resistors and conductors are employed to provide relatively constant delays despite changes in operating temperatures and voltages. The phase generator is driven by a clock signal and generates therefrom a self-resettable output signal pulse with a selectable pulse width no longer than the width of the clock signal. The variable widths are provided by varying the delays of the delay elements and adding combinational logic between respective delay elements and at the input and output of the phase generator that ensure that, in most situations, the output signal pulse is reset after a delay that is independent of the pulse width of the clock signal. Delays are lengthened by decreasing the current available to a delay element for charging the capacitors. Delays are decreased by disconnecting at least some of the capacitors so that the corresponding delay element has virtually no delay.

18 Claims, 7 Drawing Sheets

FUSE TUNABLE, RC-GENERATED PULSE GENERATOR

The present invention relates generally to systems and methods for generating signal pulses for use in electronic circuitry and particularly to systems and methods for generating signal pulses for use in integrated circuits, such as random access memories (RAM) and read-only memories (ROM).

BACKGROUND OF THE INVENTION

Countless digital electronic systems employ signal pulses to trigger/control various circuit elements. For example, the leading or falling edge of a signal pulse is often used to indicate the availability of operands to be used by a circuit element receiving the pulse or to trigger the element to initiate one or more operations. The duration of a signal pulse (i.e., the time the pulse is either high or low) also plays an important part in digital circuits. For example, it is common to use a signal pulse to enable a circuit element for operation only when the signal pulse is at an appropriate level (high or low). The periods when a memory cell is available to be programmed or read are determined by such enable signals. Enable signals are also used to control the access of input/output (I/O) devices to a common data bus or system resource.

When signal pulses are used as triggers, the shape of the pulse edge is generally the only pulse characteristic that is of interest. When a signal pulse is used as an enable signal, important pulse characteristics include:

(1) resetability (i.e., the ability of the pulse to reset itself);

(2) a pulse width that is adjustable for performance or other reasons; and (3) a pulse width that, once adjusted, remains relatively constant regardless of temperature and voltage variations.

The first of these criteria is important as an additional signal might not be available to reset a pulse after the pulse has been triggered by a first signal, such as a clock signal. The second criterion is necessary when the signal pulse is being used to enable a device for a particular operation, in which case the pulse width must be long enough to allow the device to complete the enabled operation. For example, a signal pulse used to enable a memory write operation must remain active at least as long as it takes the write to be completed. The third criterion follows from the second. That is, the adjusted pulse width should remain relatively constant at the desired value over a range of operating conditions.

Tunable pulse generators are known that can generate signal pulses that satisfy either or both of the first two criteria. Many of these prior art pulse generators are implemented in integrated circuits and employ-only transistors, some of which act as active resistors and capacitors to provide the RC delays needed to adjust signal pulse width. Active resistors and capacitors have resistance and capacitance values that vary greatly as a function of temperature and power supply voltage. Moreover, these prior art circuits tend to perform quite variably depending on the underlying fabrication process (e.g., the pmos and nmos processes can be fast, slow or typical). Therefore, these prior art pulse generators do not provide consistent pulse widths in accordance with the third criterion.

An example of one such commonly-used pulse width tuning circuit 200 is shown in FIG. 1. The circuit 200 includes a fuse 210 coupled between a VCC node and a weak, n-channel transistor 212 whose gate is coupled to the VCC node and whose source is coupled to a system ground node GND. The drain 213 of the transistor 212 is coupled to the select input SEL of a two input multiplexer (MUX) 214. The "0" input 216 of the MUX is tied to a delayed and inverted clock signal DCLK generated by an odd number of serially connected inverters 224 whose input is coupled to a global clock input CLOCK. The "1" input 218 of the MUX is coupled to the delayed clock signal DCLK via a string of inverters 220, 222.

When the fuse 210 is intact, the pull up exerted on the drain 213 by the VCC node is far stronger than the pull down of the transistor 212. Under these circumstances the signal on the SEL input is high and the version of the DCLK signal routed through the MUX is delayed by the inverters 220, 222. When the fuse 210 has been blown, the signal on the SEL input is pulled low by the transistor 212, which causes the MUX to select and output the undelayed version of the DCLK signal. The signal 215 output by the MUX is input to the NAND gate 226 along with the CLOCK signal. The output of the NAND gate 226 is coupled to the final inverter 228, which generates an output signal 229. When the CLOCK signal makes a high to low transition the output signal 229 makes a corresponding high to low transition. The output signal is automatically reset (due to the NAND gate 226) by the falling edge of the CLOCK signal or the signal 215, whichever occurs first. Thus, a shorter pulse width/shorter delay can be provided by blowing the fuse 212 and a longer pulse width/longer delay can be provided by leaving the fuse 212 intact. This circuit has the pulse width stability problems described above as it relies on the delay provided by active elements (e.g., the inverter gates), which varies as a function of power supply voltage, temperature and process.

SUMMARY OF THE INVENTION

The present invention is a fuse-tunable, RC-generated pulse generator that generates signal pulses that satisfy at least the following criteria:

(1) the signal pulses are self-resettable;

(2) the pulse width is adjustable; and (3) the pulse width, once adjusted, remains relatively constant regardless of temperature and voltage variations.

In particular, the present invention is a fuse-tunable, pulse generator implemented as part of an integrated circuit that employs passive resistors and capacitors. A preferred embodiment incorporates a delay element wherein:

(1) resistors are fabricated as polysilicon resistors, diffusion, or doped wells with a known resistance; and (2) loads/capacitors are fabricated as CMOS circuits with a capacitance provided by the gate capacitances of transistors with interconnected sources and drains.

Each delay element is driven by a pulsed input signal generated by a logic gate structure and provides a delay output signal whose voltage profile is determined by the delay element's resistance and capacitance. A logic gate structure can also have an input coupled to the delay output of a previous delay element.

When connected to the output of a delay element, the gate structure generates a gated output signal that makes a state transition only when the delayed output signal's voltage level exceeds the gate structure's threshold voltage. As a result, a signal delay is introduced between an active transition of the pulsed input signal and a corresponding change in the gated output signal. This delay is determined by two factors:

(1) the size of the delay element's RC constant; and (2) the amount of current provided to the delay element.

In a preferred embodiment, the logic gate structure can be an inverter structure that includes parallel inverters, each of which is coupled to a fuse that, when blown, disconnects the corresponding inverter. As a result of blowing a fuse the current drawn by the gate structure is decreased, which reduces the current drive of a subsequent RC delay element. This in turn increases the signal delay seen by circuit elements downstream of that delay element.

Another mechanism for tuning the delay of a delay element involves disconnecting the delay element's load. This decreases the delay element's RC constant and therefore decreases the signal delay.

The gate structure can also include a combinational logic structure (in a preferred embodiment, a NAND gate) with inputs coupled to a respective delay output signal and a global clock signal from which all of the pulsed input signals are derived. This structure enables the gated output signal to be triggered by the global clock signal and reset automatically by the delay output signal, resulting in a gated output signal whose pulse width is less than the high phase of the clock and is determined by the signal delay.

Multiple delay elements can be interconnected with multiple gate structures to provide a pulse generator that is capable of providing a correspondingly greater signal delay than a single delay element and its associated gate structures. When using multiple delay elements, one input of each combinational logic structure can be connected to the global clock signal, which ensures that the final gated output signal is triggered by the global clock signal and is reset after a time determined by the accumulated delay of the multiple delay elements. The width of the final gated output signal can be tuned by adjusting the intervening delays.

The preferred embodiment also provides a pulse width that is relatively stable for different process conditions. For example, if the present pulse generator is tuned for a TT process condition (i.e., for a typical pmos, typical nmos process), it would also work well for FF (fast pmos, fast nmos) and SS (slow pmos, slow nmos) process corners. This is because, for an FF process corner, the load capacitance increases (causing the RC constant to increase) as the saturation drain current $I_{Dsat}$ increases (increasing the speed of the active elements). These two factors have opposite effects on the circuit delay. As a result, the pulse width for the FF process corner is relatively close to that for the TT process. Similarly, for an SS process corner, both the load capacitance and the $I_{Dsat}$ decrease, which changes also produce opposite effects on the circuit delay. As a result, the pulse width for the SS process corner is relatively close to that for the TT process.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
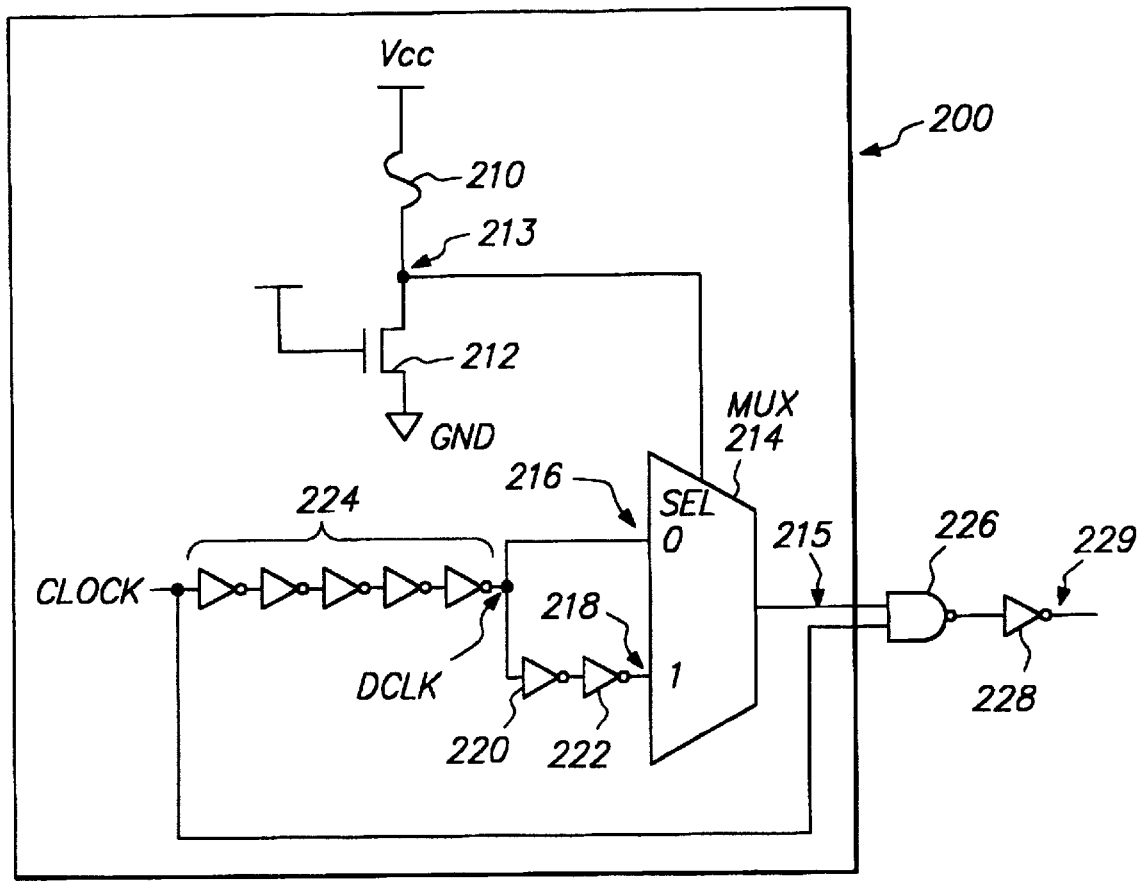
FIG. 1 is a schematic diagram of a commonly used circuit for tuning pulse width.
Figure 2B:
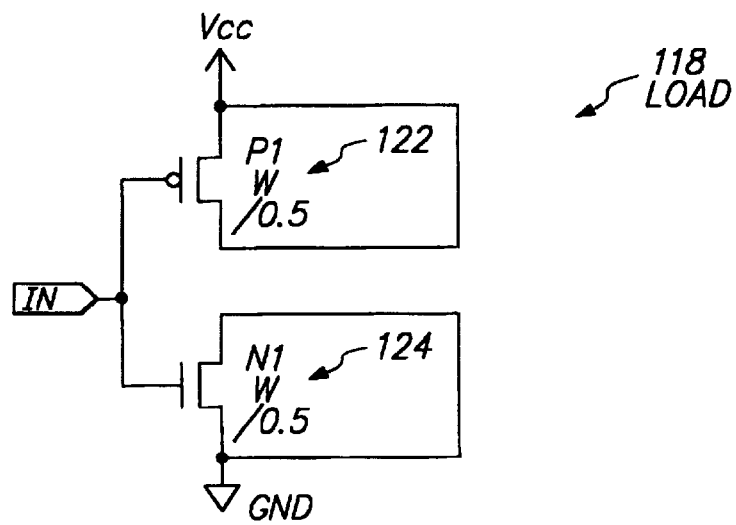
FIG. 2B is a schematic diagram showing the configuration of the load used in the embodiment of FIG. 2A.
Figure 2A:
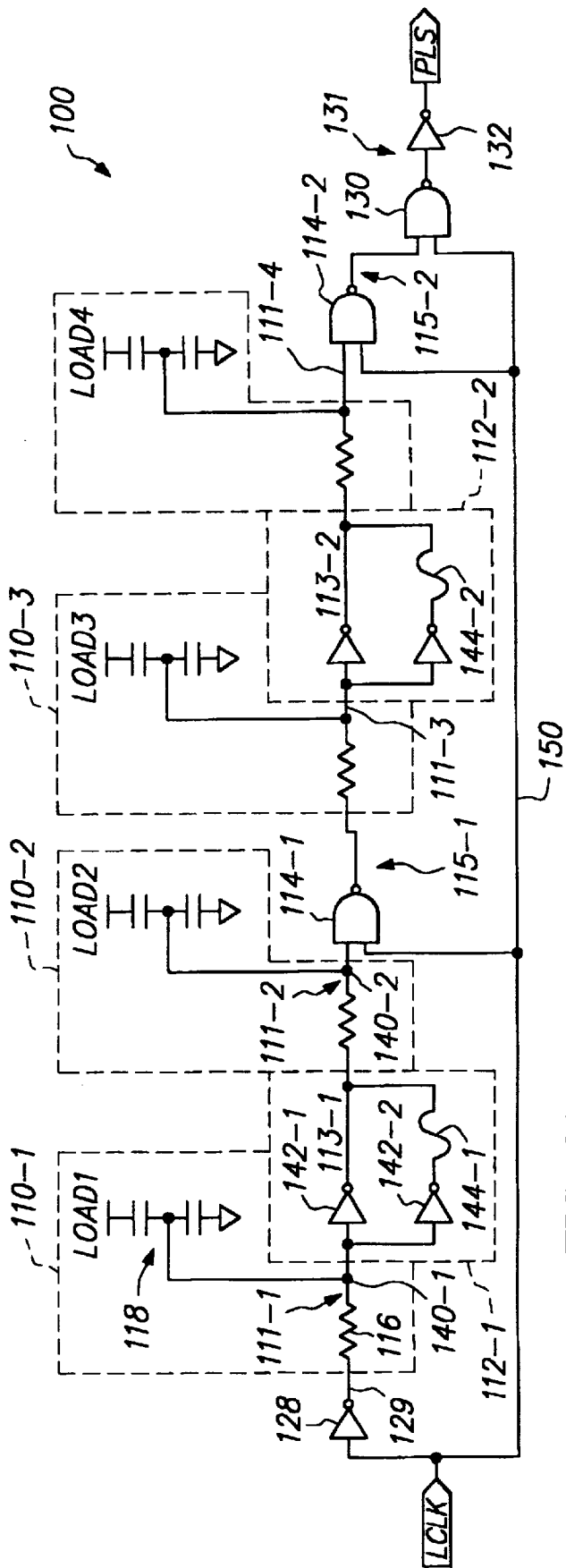
FIG. 2A is a schematic diagram of a preferred embodiment of the present invention.

Referring to FIG. 2A, there is shown a schematic diagram of a preferred embodiment of a tunable pulse generator 100 implemented in accordance with the teachings of the present invention. This embodiment includes three principle elements: a delay element 110, an inverter structure 112 and a NAND gate 114. These elements are combined in such a way that the pulse generator provides signal pulses that meet the three criteria set out above. Each of these elements is fabricated using conventional integrated circuit processing techniques, meaning that the pulse generator 100 can be implemented as part of a larger integrated circuit, such as a RAM, that requires pulse signals with specific width characteristics.

The delay element 110 includes a resistor 116 and a load 118 with, respectively, a resistance R and capacitance C. The resistor 116 is preferably fabricated as a polysilicon resistor with resistance R placed at an appropriate position along the path of a polysilicon wire or other pulse generator conductor. The techniques for fabricating "poly resistors," which have long been used in static RAMs, are well known. Poly resistors are desirable for this application as they provide resistances that are relatively constant over different operating conditions. Other techniques for fabricating a resistor 116 with similar operating characteristics include using diffusion or a doped well in the path of a conductor (e.g., in a CMOS process, the well could be an n-well).

Referring to FIG. 2B, there is shown a detailed view of a preferred embodiment of the load 118. Each load 118 includes a p-channel transistor 122 and an n-channel transistor 124. The gates of the transistors 122, 124 are connected to a common input signal IN taken off the node 140 (FIG. 2A). The source and drain of the transistor 122 are coupled to a VCC node, which is at between approximately 2.8 volts and 3.8 volts. The source and drain of the transistor 124 are coupled to a ground node GND. The capacitance of the load 118 is determined by the gate capacitances of the transistors 122 and 124. That is, when the input makes a low to high transition the gate capacitance of the p-channel transistor 122 becomes a factor and when the input makes a high to low transition the gate capacitance of the n-channel transistor 124 becomes a factor. The transistors 122 and 124 are fabricated as complementary devices and have identical channel widths and lengths. As a result, the load capacitances are relatively invariant as a function of temperature and voltage supply (e.g, VCC) differences.

The resistance R of the resistor 116 and the capacitance C of the load 118 determine the delay constant of the delay section 112. It is now described how these delay sections are employed in the pulse generator of FIG. 2A to vary signal pulse width.

Referring again to FIG. 2A, the pulse generator 100 includes four delay elements 110, two inverter structures 112, two NAND gates 114 and other logic gates, including two inverters 128, 132 and an additional NAND gate 130. The pulse generator has an input coupled to a clock signal LCLK and an output that provides a signal pulse PLS with the desired width. Each of the NAND gates 114-1, 114-2, 130 has one input coupled to the LCLK signal.

Figure 3:
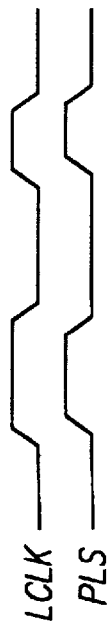
FIG. 3 is a voltage versus time plot of a signal LCLK input to the pulse generator of FIG. 2A and the pulse generator's corresponding output signal PLS.

Referring to FIG. 3, there are shown voltage versus time plots of typical LCLK and PLS signals. The PLS signal on the left has a shorter pulse width than that of the LCLK signal, makes a low to high transition shortly after the LCLK signal does, and is reset after a delay time set by the pulse generator 100 independently of the LCLK signal pulse width. The PLS signal on the right is the same width as the LCLK signal, which situation occurs when the width of the LCLK signal is no longer than the delay time set by the pulse generator 100. How the preferred embodiment generates the PLS signal with tunable pulse widths is now described in reference to FIGS. 2A and 4.

Figure 4:
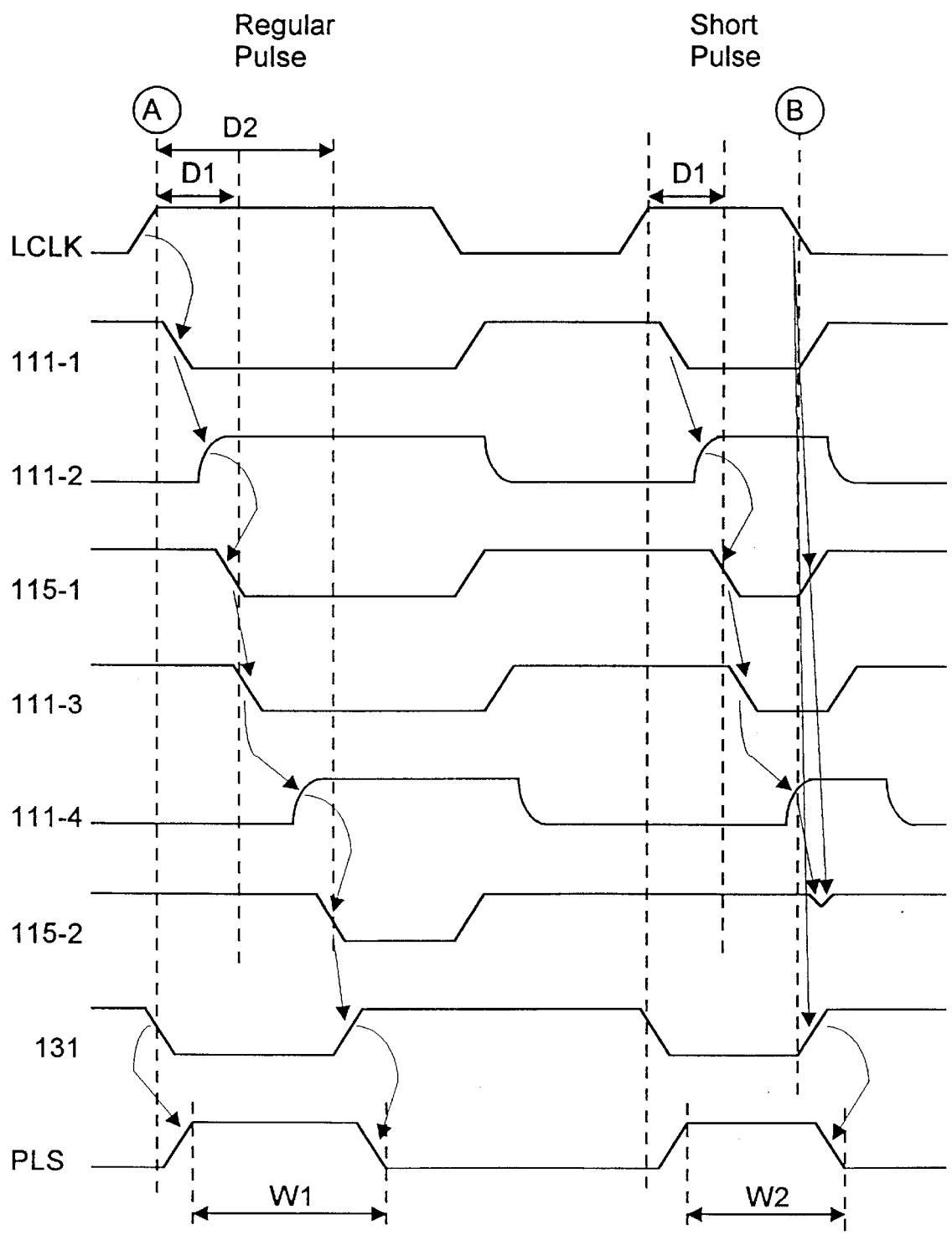
FIG. 4 is a voltage versus time plot of input and output signals for the pulse generator 100 of FIG. 2A.

Referring to FIG. 4, there is shown a timing diagram of the various signals used and generated by the pulse generator 100. Two scenarios are illustrated. On the left ("Regular Pulse") are timing diagrams for the situation where the LCLK signal has a regular width (i.e., longer than the delay time set by the pulse generator 100). On the right ("Short Pulse") are timing diagrams for the situation where the LCLK signal has a short pulse width. The regular pulse situation is now described.

Following a low to high transition A of the LCLK signal, at which time the signals 115-1 and 115-2, output respectively by the NAND gates 114-1 and 114-2 are already high, the signal 131 generated NAND gate 130 makes a high to low transition and, one gate delay later, the PLS signal, generated by the inverter 132, makes a low to high transition. Thus, a rise in the LCLK signal triggers the signal pulse PLS. The width W1 of the pulse PLS is determined by the tunable delay D2 introduced by the delay elements 110 and inverter elements 112 between the rise of the LCLK signal and the fall of the signal 115-2 generated by the second NAND gate 114-2. That is, the pulse PLS can be reset independently from the LCLK signal. The reset circuitry of the pulse generator 100 is now described.

Following the same low to high transition A of the LCLK signal, the inverter 128 generates an output signal 129 (not shown) that makes a corresponding high to low transition. The output signal is coupled to the first delay element 110-1, which generates a falling signal 111-1 at the node 140-1 whose voltage profile is determined by the delay element's RC constant. The signal 111-1 is coupled to the input of the first inverter element 112-1, which includes two inverters 142-1, 142-2. These inverters do not have to be the same size. In the preferred embodiment, the inverter 142-2 draws twice the current as the inverter 142-1. When the signal 111-1 falls below the inverter's switching voltage the inverter element 112-1 generates a low to high signal pulse 113-1 (not shown) that is coupled to the input of the next delay element 110-2.

Each delay element operates in the same manner. That is, the rate at which their corresponding output signals 111 rise or fall depends on the current available to charge the load 118. For the delay elements 110-2, 110-4 this current can be controlled using a fuse 144 coupled between the output of one of the inverters 142 and the output of the inverter element 112. When the fuse 144 is blown, the current drawn by the inverter element 112 is less (in the preferred embodiment, ⅔ less) than the current drawn by the element 112 when the fuse is intact. As a result, when the fuse 144 is blown the voltage ramp or fall off of the corresponding signal 111 is more gradual than when the fuse is not blown. This in turn delays any state transition of signals output by subsequent gates (e.g., the NAND gates 114-1, 114-2).

Conversely, the delay of a delay element can be decreased by disconnecting its load 118 from the node 140, which reduces the element's RC constant. A particular load 118 can be disconnected in any manner, including using focussed ion beams.

As already described, each NAND gate 114 has a first input coupled to the output 111 of a previous delay element 110, a second input coupled to the LCLK signal and an output connected to the input of a subsequent delay element 110. Referring to FIG. 4, the NAND gate output 115-1 is initially high then makes a high to low transition as soon as the signal 111-2 rises past the gate's switching threshold. The eventual rise of the NAND output signal 115-1 is triggered by the fall of the signal 111-2. The output signal 115-1 is coupled to the delay element 110-3, which provides a delay output signal 111-3 that makes a high to low transition triggered by the signal 115-1, some delay time D1 after the transition A of the LCLK signal.

The operation of the other inverter element 112-2 and NAND gate 114-2 is similar to that described above, except their respective output signals 113-2 (not shown) and 115-2 are even more delayed than the corresponding signals 113-1 and 115-1. Profiles of the signal 111-4 output to the NAND gate 114-2 by the delay element 110-4 and the output signal 115-2 are shown in FIG. 4. Note that, because of the intervening delays, the signal 115-2 makes a low to high transition a delay time D2 after the low to high transition A of the LCLK signal.

As mentioned above, it is desirable to provide a signal pulse that resets itself. Pulse resettability is achieved in the present invention by the NAND gate 130, which has inputs coupled to the signals LCLK and 115-2. As a result, the output 131 of the NAND gate 130 falls when the LCLK signal rises and rises when the signal 115-2 falls. The final inverter 132 inverts the signal 131 to provide the pulse PLS with the desired voltage profile and width W1, which can be adjusted using any of the following techniques.

The pulse width W1 can be lengthened by blowing a fuse 144, as described above, which is reflected in an increased delay D2 before the initial high to low transition of the signal 115-2 that resets the pulse PLS. In the preferred embodiment, the pulse width W1 can also be shortened by disconnecting the loads 118 from any of the nodes 140. This shortens the pulse width W1 because it removes almost all capacitance and therefore delay from the corresponding delay element. The delay shortening and lengthening techniques can be combined to provide varying pulse widths W1.

As for the short pulse scenario, referring to the right side of FIG. 4, the LCLK signal pulse width is shorter than the delay through the top path of the pulse generator 100. As a result, the rise of the signal 131 at point B is triggered by the fall of the LCLK signal instead of the fall of the signal 115-2. In fact, due to the early fall of the LCLK signal, the signal 115-2 never actually falls past the switching threshold of the NAND gate 130. Thus, when the LCLK pulse width is quite short, the pulse PLS is not self-resettable but is interrupted by the LCLK signal, resulting in a pulse width W2 that is the same as that of the LCLK signal.

The preferred embodiment also provides a pulse width that is relatively stable for different process conditions. For example, if the design is tuned for a TT process (i.e., for a typical pmos, typical nmos process), the pulse generator also works well for FF (fast pmos, fast nmos) and SS (slow pmos, slow nmos) process corners. This is because, for an FF process corner, the load capacitance increases (causing the RC constant to increase) as the saturation drain current $I_{Dsat}$ increases (increasing the speed of the active elements). Increasing the RC constant increases circuit delays and increasing the $I_{Dsat}$ decreases circuit delays. As a result of these offsetting effects, the pulse width generated by the preferred embodiment for the FF process corner is relatively close to that for the TT process. Similarly, for an SS process corner, both the load capacitance and the $I_{Dsat}$ decrease, which changes also produce opposite effects on the circuit delay. As a result, the pulse width for the SS process corner is relatively close to that for the TT process.

Figure 5A:
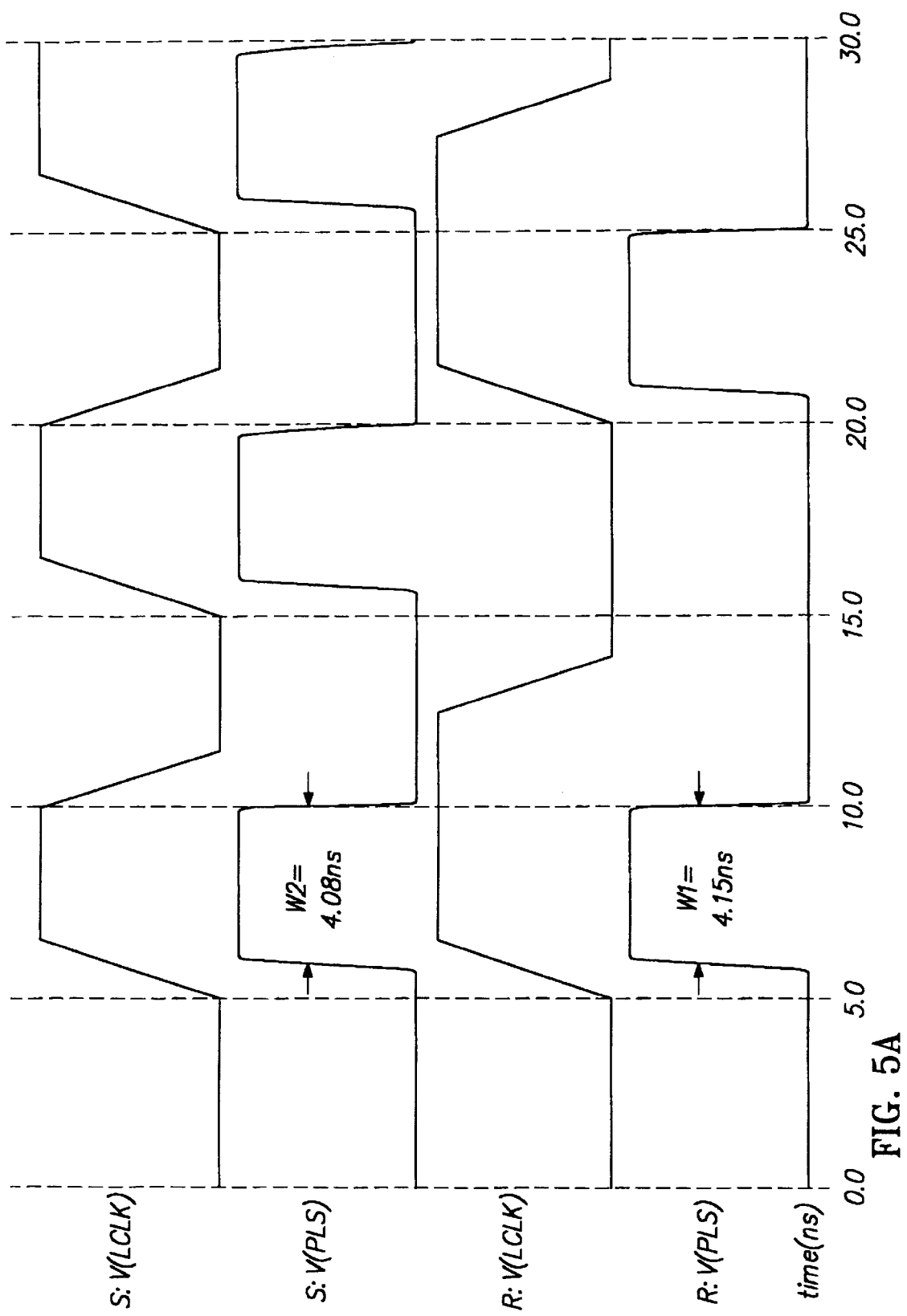
FIG. 5A is a voltage versus time plot of the input clock (LCLK) and resulting output pulses (PLS) obtained for the preferred embodiment through circuit simulation for an FF process with the power supply voltage at 3.8 V and the operating temperature at −10 degrees C.
Figure 5B:
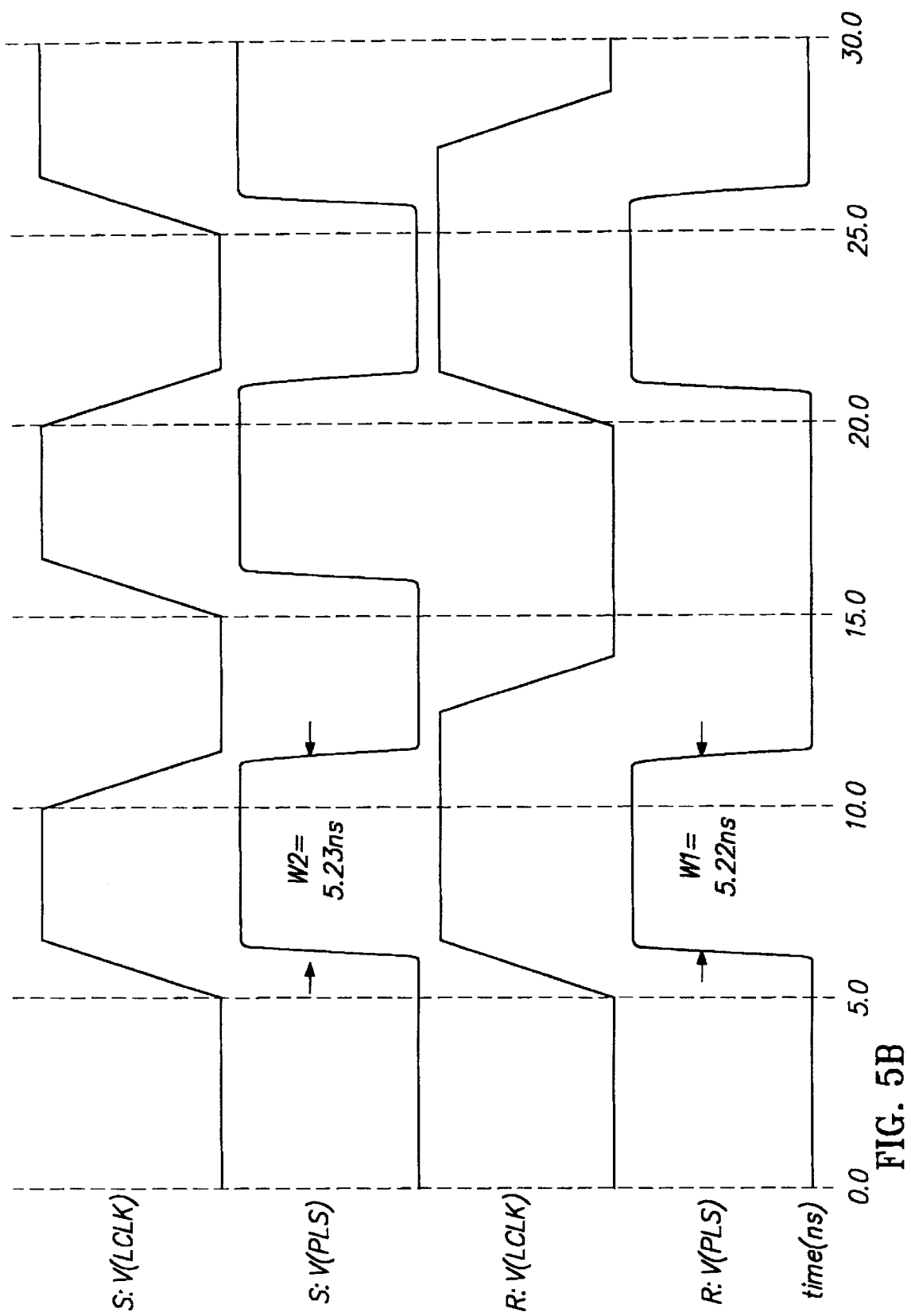
FIG. 5B is a voltage versus time plot of the input clock (LCLK) and resulting output pulses (PLS) obtained for the preferred embodiment through circuit simulation for a TT process with the power supply voltage at 2.8 V and the operating temperature at 100 degrees C.
Figure 6A:
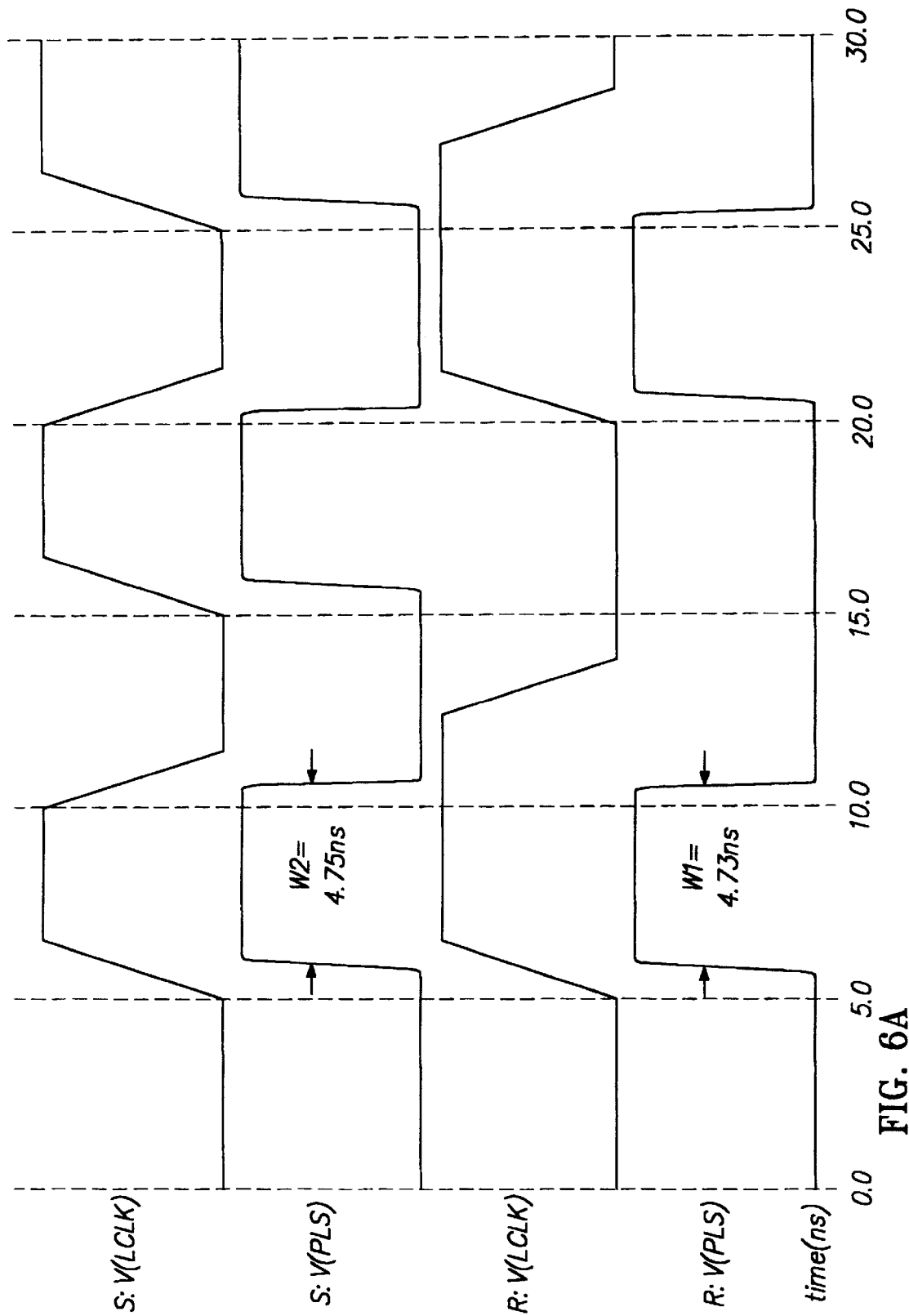
FIG. 6A is a voltage versus time plot of the input clock (LCLK) and resulting output pulses (PLS) obtained for the preferred embodiment with a blown fuse through circuit simulation for an FF process with the power supply voltage at 3.8 V and the operating temperature at −10 degrees C.
Figure 6B:
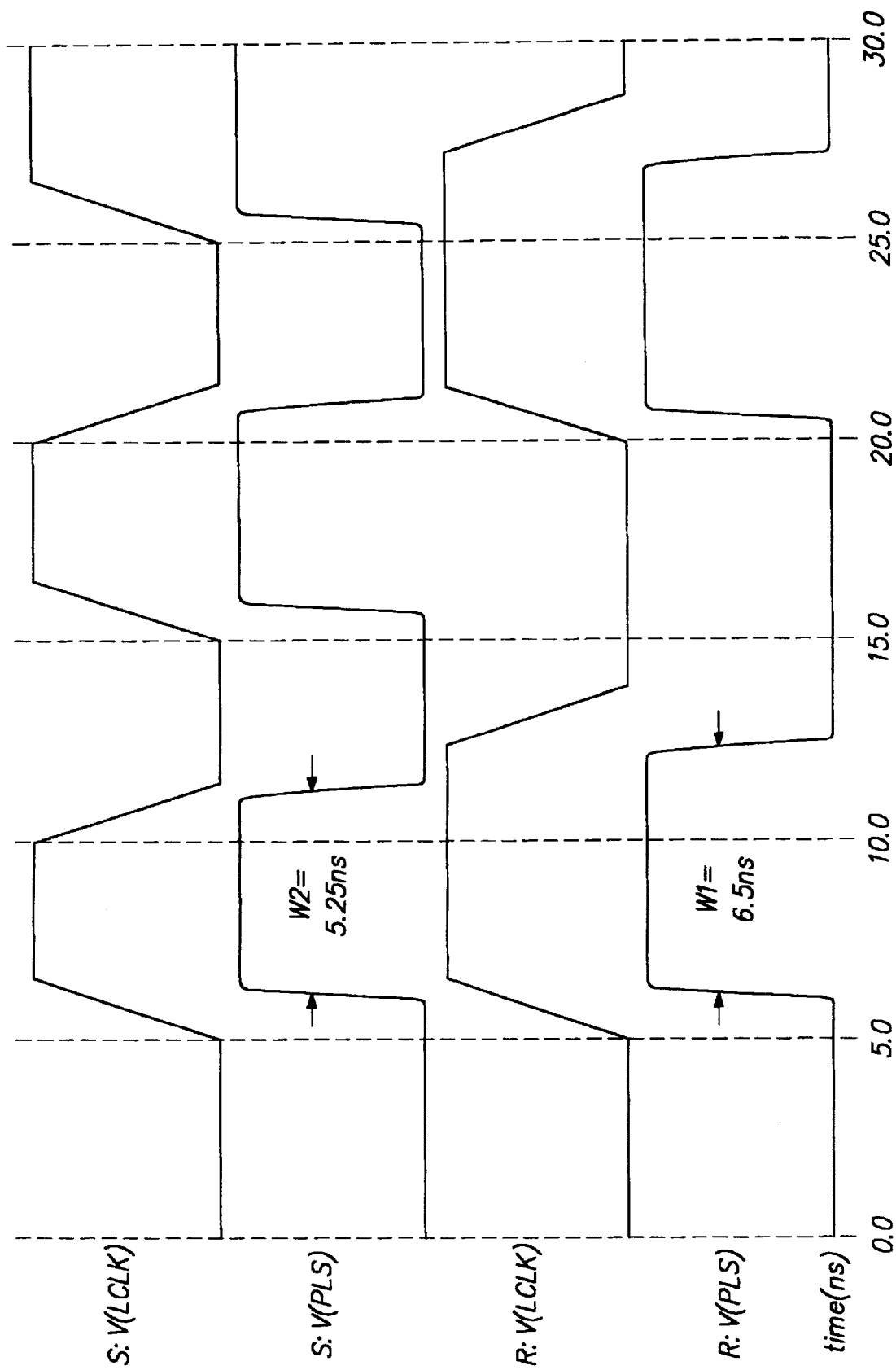
FIG. 6B is a voltage versus time plot of the input clock (LCLK) and resulting output pulses (PLS) obtained for the preferred embodiment with a blown fuse through circuit simulation for a TT process with the power supply voltage at 2.8 V and the operating temperature at 100 degrees C.

Referring to FIGS. 5A and 5B, there are shown voltage versus time plots that illustrate the pulse width stability of the preferred embodiment for different voltage-temperature-process operating conditions. Corresponding plots are shown in FIGS. 6A and 6B for the preferred embodiment where the fuses 144 have been blown. In each of these plots the PLS and LCLK curves are shown for the two different LCLK signals described in reference to FIG. 4. The curves labeled S correspond to short LCLK pulses, which cutoff the pulse signal PLS (in FIG. 5A the decrease in the pulse width is minimal due to the speed of the circuit elements), and the curves labeled R correspond to regular LCLK pulses, which do not cutoff the pulse signal PLS. The resulting pulse widths W1 (regular pulse) and W2 (short pulse) are labeled on each plot.

In particular, FIG. 5A is a voltage versus time plot of the input clock (LCLK) and resulting output pulses (PLS) obtained for the preferred embodiment through circuit simulation for an FF process with the power supply voltage at 3.8 V and the operating temperature at −10 degrees C. FIG. 5B is a voltage versus time plot of the input clock (LCLK) and resulting output pulses (PLS) obtained for the preferred embodiment through circuit simulation for a TT process with the power supply voltage at 2.8 V and the operating temperature at 100 degrees C. These conditions correspond to typical operating conditions, where the operating temperature varies between −10° C. and 110° C., operating voltage varies between 2.8 V and 3.8 V and the nominal operating pulse width is approximately 5 nsec (±12.5%). Note that the pulse width variation across this range of operating conditions is about 20%. These results are far more stable given the VCC variation of approximately 40% and the wide temperature variation than would be achieved with a conventional pulse-shaping circuit where the gate capacitance delay varies about 40% across the same range of conditions.

Similarly, FIG. 6A is a voltage versus time plot of the input clock (LCLK) and resulting output pulses (PLS) obtained for the preferred embodiment with a blown fuse through circuit simulation for an FF process with the power supply voltage at 3.8 V and the operating temperature at −10 degrees C. FIG. 6B is a voltage versus time plot of the input clock (LCLK) and resulting output pulses (PLS) obtained for the preferred embodiment with a blown fuse through circuit simulation for a TT process with the power supply voltage at 2.8 V and the operating temperature at 100 degrees C. Note that, due to the fuses being blown, the pulse widths are longer than those where the fuses are intact (FIGS. 5A, 5B). Again, these results show that the preferred embodiment is far more stable than the prior art embodiments that make use of active resistors and capacitors.

In an alternative embodiment, additional delay elements can be cascaded to provide even greater delays/shorter pulse widths. For example, in the preferred embodiment of FIG. 2A, 10–15% tuning of the nominal pulse width of 5 nsec (±12.5%) can be achieved. Correspondingly greater degrees of tuning would be achievable with more delay elements.

While the present invention has been described with reference to a few specific embodiments, the description is illustrative of the invention and is not to be construed as limiting the invention. For example, while results have been presented for specific temperatures, voltages and nominal pulse widths, the present invention is equally applicable to other operating conditions. Various modifications may occur to those skilled in the art without departing from the true spirit and scope of the invention as defined by the appended claims.

What is claimed is:

1. A tunable pulse generator, comprising:
   an input port for receiving a stimulus signal;
   a chain of delay elements; and
   a logic circuit coupled to the input port and an output of the chain of delay elements for generating a pulse in response to a predefined logic transition in the stimulus signal, where the length of the generated pulse is governed by a delay time associated with the chain of delay elements, and wherein the pulse automatically terminates after a tunable pulse duration;
   at least one of the delay elements including;
      a tunable inverter structure including a plurality of inverters with common inputs coupled to a first signal; one subset of the plurality of inverters having an output coupled to a first output node via a respective fuse; another subset having an output coupled directly to the first output node; wherein the respective fuse has a respective open/closed circuit status and an output of the tunable inverter structure is a second signal having a current strength that is a function of the open/closed circuit status of the respective fuses; and
      a delay structure including a passive resistor with an input coupled to receive the second signal and an associated resistance that varies insignificantly as a function of operating temperature and operating voltage, and a load circuit with an input coupled to an output of the passive resistor and an associated capacitance determined by gate capacitances of transistors composing the load circuit, the transistors being connected so that the associated capacitance varies insignificantly as a function of operating temperature and operating voltage; wherein the resistance and capacitance determine in accordance with current strength of the second signal a delay associated with the delay structure that determines voltage profile characteristics of a delay output signal generated by the delay structure in response to transitions of the second signal.

2. The tunable pulse generator of claim 1, wherein the passive resistor is fabricated for use in an integrated circuit as any one of:

a polysilicon resistor;

diffusion; and a doped well.

3. The tunable pulse generator of claim 1, wherein the load circuit comprises:

a n-channel transistor whose gate is coupled to the output of the passive resistor and whose source and drain are coupled to a ground node; and a p-channel transistor whose gate is coupled to the output of the passive resistor and whose source and drain are coupled to a power supply node.

4. The tunable pulse generator of claim 1, wherein the input of the load circuit can be disconnected from the output of the passive resistor; such that, when the load circuit is disconnected therefrom, the delay of the delay structure is insignificant.

5. The tunable pulse generator of claim 4, wherein the input of the load circuit is disconnected using a focussed ion beam to remove conductive path between the load circuit and the output of the passive resistor.

6. The tunable pulse generator of claim 1, wherein decreasing an inverter current in the tunable inverter structure slows the transition rate of the delay output signal.

7. The tunable pulse generator of claim 6, wherein the logic circuit comprises: a first two input NAND gate with a first input coupled to an input clock signal from which the stimulus signal is derived and a second input coupled to the output of the chain of delay elements, the NAND gate generating a first gated output signal that, when the output of the chain of delay elements is initially low, makes a high to low transition when the output of the chain of delay elements makes a subsequent low to high transition.

8. The tunable pulse generator of claim 7, wherein the logic circuit further comprises: a second two input NAND gate with a first input coupled to the first gated output signal having a first pulse width and a second input coupled to the input clock signal, the second NAND gate generating a second gated output signal that, when the first gated output signal is high, makes a high to low transition when the input clock signal makes a low to high transition and makes a low to high transition when the first gated output signal makes a high to low transition, the second gated output signal having a second pulse width approximately equal to delay between the low to high transition of the input clock signal and the high to low transition of the first gated output signal.

9. The tunable pulse generator of claim 8, wherein the load circuit is configured to be disconnectable from the output of the passive resistor; such that, when the load circuit is disconnected therefrom, the delay of the delay structure is insignificant and the first and second pulse widths are lengthened.

10. The tunable pulse generator of claim 1 wherein:

the chain of delay elements includes:

a first inverter coupled to an input clock signal configured to generate a first inverter output that is a complement thereof, the stimulus signal being derived from the input clock signal;

a first delay structure coupled to the first inverter output configured to generate a first delayed output thereof;

a first tunable inverter structure coupled to the first delayed output configured to generate a complement thereof;

a second delay structure coupled to the output of the first tunable inverter structure configured to generate a second delayed output thereof;

a first NAND gate coupled to the output of the second delay structure and the input clock signal;

a third delay structure coupled to the output of the first NAND gate;

a second tunable inverter structure coupled to the output of the third delay structure; and a fourth delay structure coupled to the output of the second tunable inverter structure; and the logic circuit includes:

a second NAND gate coupled to the output of the fourth delay structure and the input clock signal;

a third NAND gate coupled to the output of the second NAND gate and the input clock signal; and a second inverter coupled to the output of the third NAND gate, such that the second inverter generates a pulsed output signal with a pulse width approximately equal to the input pulse width less the sum of respective delays associated with the first, second, third and fourth delay structures.

11. A tunable pulse generator implemented as part of an integrated circuit, comprising:

an input circuit configured via a one time programming mechanism to generate a pulsed input signal with tuned current strength;

an RC delay structure driven by the pulsed input signal, the delay structure being configured to provide a delay output signal whose voltage profile is determined by the RC constant of the delay structure and the tuned current strength of the pulsed input signal, the RC constant varying insignificantly as a function of temperature and voltage;

a logic gate structure with an input configured to receive the delay output signal;

such that the logic gate structure generates a gated output signal that makes a state transition only when the voltage level of the delay output signal exceeds the threshold voltage of the logic gate structure, resulting in a signal delay being introduced between an active transition of the pulsed input signal and a corresponding change in the gated output signal, the length of the signal delay being determined by:

the RC constant of the delay structure, and the tuned current strength of the pulsed input signal;

wherein the input circuit comprises a tunable inverter structure including a plurality of inverters with common inputs coupled to a first signal; one subset of the plurality of inverters having an output coupled to a first output node via a respective fuse; another subset having an output coupled directly to the first output node; wherein the respective fuse has a respective open/closed circuit status and an output of the tunable inverter structure is a second signal having a current strength that is a function of the open/closed circuit status of the respective fuses, the second signal being the same as the pulsed input signal; and wherein the delay structure comprises a passive resistor and a load circuit whose respective resistance and capacitance determine the RC constant and vary insignificantly as a function of temperature and voltage.

12. The tunable pulse generator of claim 11, wherein decreasing the inverter current in the tunable inverter structure slows the transition rate of the delay output signal.

13. The tunable pulse generator of claim 11, wherein the passive resistor is fabricated for use as any one of:
- a polysilicon resistor;
- diffusion; and
- a doped well.

14. The tunable pulse generator of claim 11, wherein the load circuit comprises:
- an n-channel transistor whose gate is coupled to the output of the passive resistor and whose source and drain are coupled to a ground node; and
- a p-channel transistor whose gate is coupled to the output of the passive resistor and whose source and drain are coupled to a power supply node.

15. The tunable pulse generator of claim 14, wherein the input of the load circuit can be disconnected from the output of the passive resistor; such that, when the load circuit is disconnected therefrom, the delay of the delay structure is insignificant.

16. The tunable pulse generator of claim 15, wherein the input of the passive capacitor is disconnected using a focussed ion beam to remove conductive path between the load circuit and the output of the passive resistor.

17. The tunable pulse generator of claim 11, wherein the logic gate structure comprises a two input NAND gate with a first input coupled to an input clock signal from which the pulsed input signal is derived and a second input coupled to the delay output signal, the NAND gate generating a first gated output signal that, when the delay output signal is initially low, makes a high to low transition when the delay output signal makes a subsequent low to high transition.

18. The tunable pulse generator of claim 17, wherein the logic gate structure further comprises:
- a second two input NAND gate with a first input coupled to the first gated output signal and a second input coupled to the input clock signal, the second NAND gate generating a second gated output signal that, when the first gated output signal is high, makes a high to low transition when the input clock signal makes a low to high transition and makes a low to high transition when the first gated output signal makes a high to low transition;
- the second gated output signal having a pulse width approximately equal to delay between the low to high transition of the input clock signal and the high to low transition of the first gated output signal.

* * * * *